United States Patent [19]

Haight et al.

[11] Patent Number: 4,763,086

[45] Date of Patent: Aug. 9, 1988

[54] AUTOMATIC GAIN CONTROL FOR TANK TYPE VOLTAGE CONTROLLED OSCILLATOR

[75] Inventors: Michael H. Haight, Plano; William H. Giolma, Dallas, both of Tex.; Richard Boucher, Santa Clara, Calif.

[73] Assignee: Texas Instruments Incorporated, Dallas, Tex.

[21] Appl. No.: 49,186

[22] Filed: May 12, 1987

[51] Int. Cl.[4] .......................... H03B 5/08; H03L 5/00
[52] U.S. Cl. ................................ 331/109; 331/117 R; 331/177 V; 331/183
[58] Field of Search .................... 331/36 C, 109, 112, 331/117 R, 117 FE, 117 D, 167, 168, 172, 173, 177 V, 183

[56] References Cited

U.S. PATENT DOCUMENTS 4,608,544 8/1986 Nordholt et al. ................ 331/109

Primary Examiner—Gene Wan
Assistant Examiner—David Mis
Attorney, Agent, or Firm—Richard G. Coalter; Leo N. Heiting; Melvin Sharp

[57] ABSTRACT

A voltage controlled oscillator circuit of a type having a tank circuit for generating oscillations which includes a means for establishing a fixed bias voltage with respect to ground at a bias end of said tank circuit, means for drawing current from an a.c. end of said tank so as to control the tank gain, and an AGC capacitor. A constant current source is coupled to the AGC capacitor for supplying it with a constant charging current. Means are provided for discharging the AGC capacitor at a voltage level determined by a ratio of resistors and a transistor emitter-base ratio.

10 Claims, 1 Drawing Sheet

AUTOMATIC GAIN CONTROL FOR TANK TYPE VOLTAGE CONTROLLED OSCILLATOR

BACKGROUND

The present invention relates to a circuit for automatically controlling the gain of a tank type oscillator, in particular a voltage controlled oscillator.

A voltage controlled oscillator is simply an oscillator whose frequency is proportional to an externally applied voltage. Integrated-circuit VCOs are usually simply R-C multivibrators in which the charging current in the capacitor is varied in response to the control input. However, switching transient durations at higher frequencies themselves become a large percentage of the period of the oscillation causing center frequency drift. The duration of the switching transients depends on circuit parasitics, circuit resistances, transistor transconductance, and transistor input resistance, which are all temperature sensitive. A more temperature resistant voltage controled oscillator circuit is one which uses a tank circuit consisting of an inductor and parallel capacitor. However, there are no known circuits which satisfactorily control the tank node peak-to-peak swing of such a circuit.

Accordingly, there is provided an improved automatic gain control for a tank type oscillator, especially a voltage controlled oscillator of the tank type.

SUMMARY OF THE INVENTION

According to the invention there is provided a tank circuit for generating oscillations, which includes a diode assembly coupled from a bias end of the tank to ground to establish a bias point of a fixed voltage with respect to ground at the bias end. A current sinking circuit coupled to an oscillating end of the tank draws current from the tank during half cycles so as to control the tank gain. An automatic gain control (AGC) discharge circuit coupled to an AGC capacitor has a resistor chain for establishing a reference voltage substantially independent of active device parameters and a discharge transistor coupled to the reference voltage and to the AGC capacitor responsive to discharge the AGC capacitor upon the tank voltage exceeding a predetermined value dependent on said reference voltage. The automatic gain control feature of the invention is especially useful in a voltage controlled oscillator circuit having a tank type oscillator circuit.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
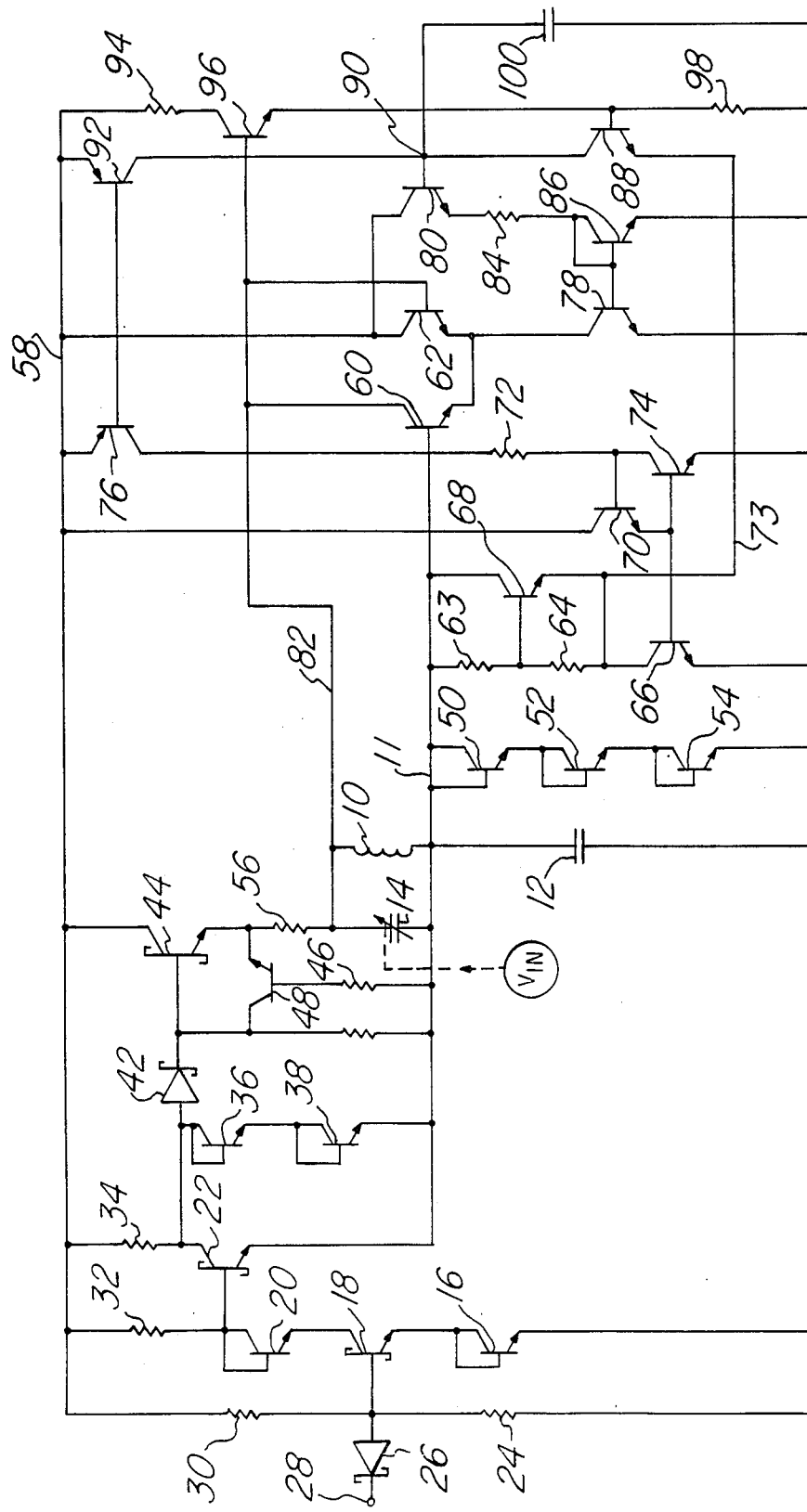
FIG. 1 is a circuit diagram of a preferred embodiment of the invention.

Referring to FIG. 1 there is shown a voltage controlled oscillator having a coil 10 and a voltage variable capacitor 14. An additional capacitor 12 couples a bias line 11 to ground. A logic clamp input line 28 coupled through a Schottky diode 26 to the base of a Schottky transistor 18. Resistor 30 biases transistor 18 on. Resistor 24 aids in turning transistor 18 off by channeling base charge to ground. Transistor 16 couples the emitter of transistor 18 to ground and adds one emitter-base voltage to the input logic threshold on line 28. Transistor 20 coupled to the collector of transistor 18 is diode connected as is transistor 16 and adds an emitter-base voltage between the base of Schottky transistor 22 and the collector of transistor 18. Resistor 32 provides bias current for the base of transistor 22 and collector current for transistor 18.

Schottky transistor 22 has its emitter coupled through diode connected transistors 50, 52 and 54 to ground thereby setting the bias voltage on line 11 to three emitter-base voltages above ground. The collector of transistor 22 drives a load resistor 34 and also couples to the base of NPN transistor 44 through Schottky diode 42. A pair of diode connected transistors 36 and 38 couple the collector of transistor 22 to its emitter. The collector of transistor 44 connects to high voltage line 58 while its emitter connects to coil 10 through a clamp resistor 56. The emitter of transistor 48 connects to the emitter of transistor 44 while its collector connects to the base of transistor 44. The base of transistor 48 is coupled to line 11 through resistor 46. The collector of transistor 60 of a differential pair current current steering circuit consisting of transistors 60 and 62 is coupled to an alternating voltage end of coil 10 and to the base of transistor 62. The base of transistor 60 connects to line 11 while the emitters of transistors 60 and 62 connect through the collector of NPN transistor 78 to ground. The alternating voltage end of coil 10 couples to line 82 which connects to the collector of transistor 60, to the base of transistor 62 and to the base of transistor 96. Transistors 66 and 74 form a current mirror with the size of transistor 66 being 5 times that of transistor 74. Thus, for a given current through transistor 74 there will be about 5 times that current through transistor 66. Other size ratios of transistor 66 to transistor 74 could be used.

Base drive to transistors 66 and 74 is provided by the emitter of transistor 70. The base of transistor 70 is connected to the collector of transistor 74. The voltage drop across the collector to emitter of diode connected transistor 76 plus the voltage drop across resistor 72 and the base to emitter junction voltage of transistor 74 (which equals that of transistor 66) determines the emitter to base voltage of transistor 70 and hence the current drawn by the latter. Thus, resistor 72 sets the current through transistor 74 and the size ratio of transistors 66 and 74 determine the current through transistor 66.

The value of resistors 63 and 64 and the emitter to base voltage of transistor 68 determines the voltage of the emitter of transistor 68 (and 88). The voltage of the emitter of transistor 68 on line 73 is equal to the following:

$$V_{73} = V_{11} - (1 + R_{63}/R_{64})V_{be}$$

where $V_{be}$ is the emitter to base voltage of transistor 68. The pair of PNP transistors 76 and 92 also form a current mirror in which the current through transistor 92 equals that through transistor 76 because of their equal sizes, however, other size ratios could be used. Both of the emitters of transistors 76 and 92 are connected to a positive voltage supply line 58. The collector of transistor 92 is connected to AGC node 90 to which an AGC capacitor 100 is also coupled. Current mirror comprising transistors 76 and 92, in this case, apply approximately 200 microamperes full time to the AGC capacitor 100 coupled to node 90 as set primarily by resistor 72. The collector of transistor 88 connects to AGC node 90 and its emitter to emitter line 73. Current through resistor 98 determines the emitter to base voltage of transistor 96. Transistor 96 presents a voltage to the base of transistor 88 equal to the line 82 voltage minus the transistor 96 emitter to base voltage. Current in transistor 88 flows only when the base voltage exceeds the voltage set on line 73 by a sufficient amount. When transistor 88 conducts its collector current it removes charge from capacitor 100 and thereby reduces the voltage on line 90.

Differential NPN transistors 60 and 62 have their emitters connected to the collector of transistor 78. The collector of transistor 62 connects to Vcc line 58 and to the collector of transistor 80. The collector of transistor 60 connects to tank line 82. The emitter of transistor 80 connects to one end of resistor 84, the other end of which couples to diode connected transistor 86. As the voltage across the tank oscillates, transistor 62 turns on during the positive half cycles and off during the negative half cycles. In order to keep the current through transistor 78 constant as determined by the voltage on node 90 and the resistance of resistor 84, transistor 60 conducts current from the tank line 82. The tank gain is determined by the collector current transistor 60 draws.

As the voltage on tank line 82 varies due to tank oscillation, the emitter follower transistor 96 varies the current through resistor 98. The varying voltage across resistor 98, in turn, is applied to the base of transistor 88. Transistor 88 begins to discharge current from AGC node 90 when its base voltage reaches the voltage on line 73 plus an emitter-base forward voltage drop. The voltage at which transistor 88 begins to discharge the AGC node 90 is determined by the voltage on line 73. This voltage is the principal amplitude control in that the higher the voltage of emitter line 73, the higher the peak voltage amplitude across the inductor 10. A secondary controlling factor is the ratio of collector current of transistor 66 to that of transistor 92, whereby a smaller ratio yields a higher peak amplitude. Negative feedback within the AGC circuit to stabilize oscillator amplitude is provided by transistor 88 discharging increasing total current per cycle (integrated discharge current) as the oscillator amplitude increases until a stable condition exists where the integrated discharge current balances the current sourced by the collector of transistor 92.

Since transistor 80 draws only a small base current from AGC node 90, the discharge of the AGC capacitor 100 is determined principally by resistors 63 and 64. The voltage on the AGC capacitor 100 controls the voltage at the emitter of transistor 80 and hence the voltage across resistor 84 since the drop across transistor 86 is just a diode forward drop. The current conducted by transistor 78 depends only on the size ratio of it to that of transistor 86 and is therefore a fixed factor of the current through resistor 84. As the AGC voltage increases, greater current is drawn from the emitters of the differential pair 60 and 62 which increases the current drawn from the tank and reduces its gain. Since the AGC threshold level at which transistor 88 turns on and draws off charge from the AGC capacitor 100 is dependent principally on a resistor ratio and an emitter-base voltage there is relatively little dependence on temperature sensitive factors such as transistor gain.

The operation of the tank circuit clamp is designed to stop the oscillation within 2 periods of invoking input logic on clamp line 28 and to start up and free run from a known state when unclamped. With the logic clamp signal on line 28 low, transistor 18 is biased off and transistor 22 is on. Therefore diode connected transistors 36 and 38 are held off by the low collector-emitter saturation voltage of transistor 22. The low voltage on the collector of transistor 22 causes transistor 44 to remain off thereby leaving a high impedance in parallel with the tank circuit consisting of coil 10 and capacitor 14 in series with capacitor 12. Thus, the tank circuit is free to oscillate.

When the voltage on line 28 is raised above the sum of the emitter base voltages of transistors 16 and 18 less the forward drop across diode 26, then transistor 18 turns on, dropping the base voltage of transistor 22 and turning off the latter. Diode connected transistors 36 and 38 in combination with resistor 34 then set the voltage of the collector of transistor 22. Thus, transistor 44 turns on driving current through resistor 56 and coil 10. Resistor 56 is external to the semiconductor bar on which the clamp circuit and associated other circuitry is located and is valued so that the inductor current is the same for the clamped and unclamped states. With the inductor current so set, upon shutting off the inductor current the oscillation restarts from a peak position in the oscillation corresponding to the peak magnitude of the inductor current.

In a phase-locked loop application voltage across the voltage variable capacitor 14 is governed by an input signal $V_{in}$ normally provided by an integrator/charge pump (not shown). As the voltage is increased, the capacitance of voltage variable capacitor 14 decreases and the frequency of oscillation increases.

The function of transistor 48 is to turn on if the emitter of transistor 44 should inadvertantly be grounded and thereby shut off transistor 44.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. An oscillator circuit having a tank circuit for generating oscillations, comprising:
   means for establishing a fixed bias voltage with respect to ground at a bias end of said tank circuit;
   means for sensing voltage from an alternating voltage end of said tank so as to control the tank gain;
   an automatic gain control (AGC) capacitor;
   a constant current source coupled to said AGC capacitor for supplying a constant charging current to said AGC capacitor; and
   means for discharging said AGC capacitor when the tank oscillation voltage exceeds a voltage level determined by a ratio of resistors, a transistor emitter-base ratio and a supply voltage.

2. A circuit according to claim 1, wherein said AGC discharging means includes a reference voltage line, a current mirror having a transistor coupled from said reference voltage line to ground for drawing a constant current to ground, a reference setting transistor having a collector connected to said said bias end, an emitter connected to said reference line and a resistor chain connected from said bias end to said reference line with a base of said reference setting transistor connected at a preselected point along said resistance chain so as to establish a selected voltage on said reference line and means for conducting current from said AGC capacitor whenever the voltage on the a.c. end of said tank exceeds said reference voltage by a predetermined magnitude.

3. A circuit according to claim 1, wherein said current drawing means includes a pair of differentially connected transistors with emitters connected in common to a constant current source and a collector of a first one connected to an a.c. end of said tank and a base connected to a fixed bias end thereof, a second one having a base connected to the a.c. end and a collector connected to a high voltage source, means for drawing an emitter current from said differential pair of transistors of a magnitude dependent upon the voltage across said AGC capacitor.

4. A circuit according to claim 3, wherein said emitter current drawing means includes a current mirror having a diode connected transistor, a resistor and an AGC transistor emitter-base path connected between a high voltage source and ground, a transistor having a collector connected to the emitters of said pair of differentially connected transistors and an emitter connected to ground and a base connected to the base of said diode connected transistor.

5. An oscillator circuit having a tank circuit with a variable gain for generating oscillations, comprising:
a diode assembly coupled from a bias end of the tank to ground to establish a bias point of a fixed voltage with respect to ground at the bias end;
an automatic gain control (AGC) capacitor;
a current sinking circuit coupled to an oscillating end of the tank for drawing current from the tank during selected half cycles of an amount dependent on the voltage across said AGC capacitor so as to control the tank gain;
an AGC discharge circuit coupled to the AGC capacitor and having a resistor chain for establishing a reference voltage substantially independent of active device parameters and a discharge transistor coupled to said reference voltage and to the AGC capacitor for discharging the AGC capacitor when the tank voltage exceeds a predetermined value dependent on said reference voltage.

6. A circuit according to claim 5, wherein said AGC discharge circuit includes a reference voltage line, a current mirror having a transistor coupled from said reference voltage line to ground for drawing a constant current to ground, a reference setting transistor having a collector connected to said bias end, an emitter connected to said reference line and a resistor chain connected from said bias end to said reference line with a base of said reference setting transistor connected at a preselected point along said resistance chain so as to establish a selected voltage on said reference line and means for conducting current from said AGC capacitor whenever the voltage on the a.c. end of said tank exceeds said reference voltage by a predetermined magnitude.

7. A circuit according to claim 5, wherein said current sinking circuit includes a pair of differentially connected transistors with emitters connected in common to a constant current source and a collector of a first one connected to an a.c. end of said tank and a base connected to a fixed bias end thereof, a second one having a base connected to the a.c. end and a collector connected to a high voltage source, means for drawing an emitter current from said differential pair of transistors of a magnitude dependent upon the voltage across said AGC capacitor.

8. A circuit according to claim 7, wherein said emitter current sinking includes a current mirror having a diode connected transistor, a resistor and an AGC transistor emitter-base path connected between a high voltage source and ground, a transistor having a collector connected to the emitters of said pair of differentially connected transistors and an emitter connected to ground and a base connected to the base of said diode connected transistor.

9. A circuit according to claim 1 or 5 further comprising means for varying the frequency of oscillations generated by said tank circuit.

10. A circuit according to claim 1 or 5 wherein said tank circuit comprises a variable capacitor adapted to receive a control signal, said capacitor having a capacitance that varies in accordance with a received control signal.

* * * * *